US006249536B1

(12) United States Patent
Farries et al.

(10) Patent No.: US 6,249,536 B1
(45) Date of Patent: Jun. 19, 2001

(54) LASERS

(75) Inventors: Mark Cunnigham Farries, Nepean (CA); Jan Jozef Lewandowski, Acton (GB); David James Robbins, Abthorpe (GB); Peter John Williams, East Hunsbury (GB)

(73) Assignee: GEC-Marconi Limited, Stanmore (GB)

( * ) Notice: Subject to any disclaimer, the term of this patent is extended or adjusted under 35 U.S.C. 154(b) by 0 days.

(21) Appl. No.: 09/269,406

(22) PCT Filed: Sep. 18, 1997

(86) PCT No.: PCT/GB97/02514

§ 371 Date: Jun. 14, 1999

§ 102(e) Date: Jun. 14, 1999

(87) PCT Pub. No.: WO98/13913

PCT Pub. Date: Apr. 2, 1998

(30) Foreign Application Priority Data

Sep. 27, 1996 (GB) ................................................. 9620193
Jun. 30, 1997 (GB) ................................................. 9713803

(51) Int. Cl.$^7$ ....................................................... H01S 3/03
(52) U.S. Cl. ............................... 372/64; 372/92; 372/108
(58) Field of Search ................................. 372/64, 108, 92

(56) References Cited

U.S. PATENT DOCUMENTS

| 4,251,780 | 2/1981 | Scifres et al. |
| 4,349,905 | 9/1982 | Ackley . |
| 4,852,113 | 7/1989 | Botez . |
| 4,942,585 | 7/1990 | Ungar . |
| 5,321,718 | 6/1994 | Waarts et al. |
| 5,537,432 | 7/1996 | Mehuys et al. |
| 5,539,571 | * 7/1996 | Welch et al. ........................... 359/344 |
| 5,544,268 | * 8/1996 | Bischel et al. ............................ 385/4 |
| 5,602,864 | * 2/1997 | Welch et al. ............................ 372/50 |
| 5,703,897 | * 12/1997 | Welch et al. ............................ 372/50 |
| 5,761,234 | * 6/1998 | Craig et al. ............................. 372/50 |
| 5,793,521 | * 8/1998 | O'Brien et al. ....................... 359/344 |

FOREIGN PATENT DOCUMENTS

| 0226445 | 6/1987 | (EP) . |
| 0337688 | 10/1989 | (EP) . |
| 2191630 | 6/1987 | (GB) . |
| 2198582 | 6/1988 | (GB) . |
| 2201838 | 7/1988 | (GB) . |

OTHER PUBLICATIONS

C.J. Hwang, "Incoherent GaAlAs/GaAs Semiconductor laser arrays" The International Society for Optical Engineerings, 1988, vol. 893, pp. 30–34.

C.W. Trussell, "High brightness laser diode arrays" The International Society for Optical Engineerings, 1995, vol. 2397, pp. 244–248.

Jiang Z, "Numerical Simulation of High Power Filament..." International Journal of Optoelectronics, vol. 10, No. 5, Sep. 1995, pp. 373–381.

Takemasa Tamunuki, "High Power and Narrow Lateral Far Field Divergence . . ." Institute of Electrical and Electronics Engineers, pp. 725–728.

* cited by examiner

*Primary Examiner*—Leon Scott, Jr.
(74) *Attorney, Agent, or Firm*—Donald C. Casey

(57) ABSTRACT

The array is highly suitable for producing a spacially wide output "beam" (comprising a number of individual beams). It suffers less from problems of hotspots and filamentation since each tapered laser supports a limited number of modes, or even a single mode. Therefore it produces a semiconductor laser which is especially suitable for pumping of other lasers and to be used in materials processing.

17 Claims, 2 Drawing Sheets

LASERS

This invention relates to lasers.

There are many applications for which high power semiconductor lasers are suitable particularly where operation is required in the near infra-red. These include materials processing and micromachining. A requirement in these applications is that the output of the laser can be focussed to a small spot so that a material may be sufficiently heated to cause a chemical change, ablation or burning. Other applications include range finding and as pumps for fibre lasers. In these applications optical brightness is a key parameter and should be as high as possible. The optical brightness, which determines the size of the spot to which the emitted light can be focussed, is given by the power per unit area per unit solid angle.

There is a limit to the brightness of light which can be emitted by a semiconductor laser. This is due to the optical power handling capacity of the surface or facet from which the light is emitted. If the optical power density in this region is too high this can lead to degradation of the laser. Therefore, at the maximum optical power density, the brightness can only be increased by reducing the divergence of the beam from the laser.

A number of methods have been proposed for increasing the brightness of semiconductor lasers. These include fabricating a waveguide comprising a tapered laser (K. A. Williams et al "Q-switched bow-tie lasers for high energy picosecond pulse generation", Electronic Letters, volume 30, no. 4, pp320–321, 1994), tapered laser amplifiers (D. Mehuys "5.25-W CW near diffraction limited tapered stripe semiconductor optical amplifier", IEEE Photonic Technical Letters volume 5, no. 10, pp1179–1182, 1993) and anti-guide laser arrays (D. Botez, "High power monolithic phase-locked arrays of anti-guide semiconductor diode lasers", IEE Proceedings, volume 139, pp14–23, 1992). A disadvantage of tapered laser waveguides and tapered laser amplifiers is that they have a limited power range over which they will maintain a narrow lateral divergence. At powers above this limited range, optical and carrier induced index chances disrupt the waveguide and cause filamentation of emitted light which leads to an increase in the beam divergence. Although anti-guide lasers have been proposed as a solution to this problem, they are difficult to make due to the very tight tolerances required for the waveguide widths. Furthermore, a substantial fraction of the output power is emitted in side lobes, which decreases the brightness of these devices.

According to the invention is provided an incoherent array of tapered semiconductor lasers.

Preferably the tapered laser array comprises a plurality of waveguides. Each waveguide may comprise an individual tapered laser. Preferably each waveguide will support only one transverse optical mode. Alternatively two or more optical modes may be supported. Preferably each waveguide has a narrow region and a tapered region which tapers out to a wide output region.

Preferably the array is formed by depositing layers on a single substrate. Preferably the array is formed on a single laser chip. Waveguides on the chip may be formed by an etching step of one or more layers. All of the tapered lasers may be formed together.

Limiting the number of modes which will be generated in each waveguide increases the brightness, reduces internal losses and increases internal efficiency of the device.

Preferably the lasers are ridge loaded structures. Alternatively they may be buried structures.

Limiting the number of modes may be achieved by having a small refractive index step. Limiting the number of modes may also be achieved by having a narrow width at one end of the waveguides. This may cut off higher order modes. In one embodiment the narrow region of the waveguides may have a width of less than 10 $\mu$m, preferably it is 5 $\mu$m or less and most preferably it is between 3 and 5 $\mu$m. The refractive index step may be less than 0.3. Preferably it is 0.2 or less, most preferably it is between 0.005 and 0.015. Other combinations of width and refractive index step may also provide suitable mode selection. The narrow end may be referred to as the input end because it is at the other end of the waveguides to the output end.

Preferably each waveguide tapers out to a wide output end. The term wide is relative and means that it is wider than the narrow region. The width of each waveguide at the output end may be chosen such that the optical intensity is not sufficient to cause damage to a facet at the output end. Preferably the taper spreads out to a width of between 5 and 100 $\mu$m. Most preferably the width is approximately 30 $\mu$m. The width must be small compared to the taper length so that the resulting taper angle is low enough to prevent coupling to higher order modes.

Each waveguide may comprise a straight section and a tapered section. The sides of the tapered section may be straight or may be shaped in some other manner. They may follow a parabolic shape. A parabolic shaped taper has the advantage of giving lower transverse mode coupling than a taper with straight sides. For a parabolic shape, the sides of the taper may diverge most at a region near the straight section and then diverge less and less along the taper away from the straight section. The sides of the taper may be substantially parallel at the output end.

The width of the beam emitted by the array is dependent on the number of waveguides. Therefore the array may be scaled-up by increasing the number of waveguides whilst still maintaining a low divergence output.

The waveguides may be between 500 and 2000 $\mu$m long. Preferably they are between 700 and 1200 $\mu$m long. Most preferably they are approximately 1000 $\mu$m long. In one embodiment the straight section of each waveguide is between 100 and 300 $\mu$m long and the tapered section is between 600 and 900 $\mu$m long. The length can be set to optimise the external quantum efficiency of the waveguides while maintaining taper angles shallow enough for single mode operation.

Preferably the waveguides are defined in an active layer by a conductive structure of an appropriate shape for example tapered.

An angle defined by the edge of the waveguide and the longitudinal axis of the waveguide is referred to as the taper angle. Preferably the taper angle is less than 2°.

Preferably each waveguide has a reflection coating applied at each end. Preferably a high reflectivity coating is present at the input end. Preferably the reflectivity is more than 95%. Most preferably it is approximately 98%. Preferably a low reflectivity coating is present at the output end. Preferably the reflectivity is less than 3%. Most preferably it is between 0.5 and 1%.

Preferably the waveguides are closely spaced such as to provide a relatively uniform brightness across the width of the output end of the array. Preferably the space between adjacent waveguides at the output end is less than 500 $\mu$m, more preferably less than 200 $\mu$m. Most preferably it is between 5 $\mu$m and 100 $\mu$m. In various preferred embodiments it may be approximately 10, 20, 30, 40, 50, 60, 70, 80 or 90 $\mu$m.

Preferably the lasers operate in the range 0.8–2.5 μm. Most preferably they operate in the range 0.8–1 μm. However by choosing the correct material system such as GaN then they may operate as low as 0.4 μm.

By using an array of tapered lasers, light may be emitted having both a narrow lateral beam divergence and high output power.

Embodiments of the invention will now be described, by way of example only, with reference to the accompanying drawings in which.

Figure 1:
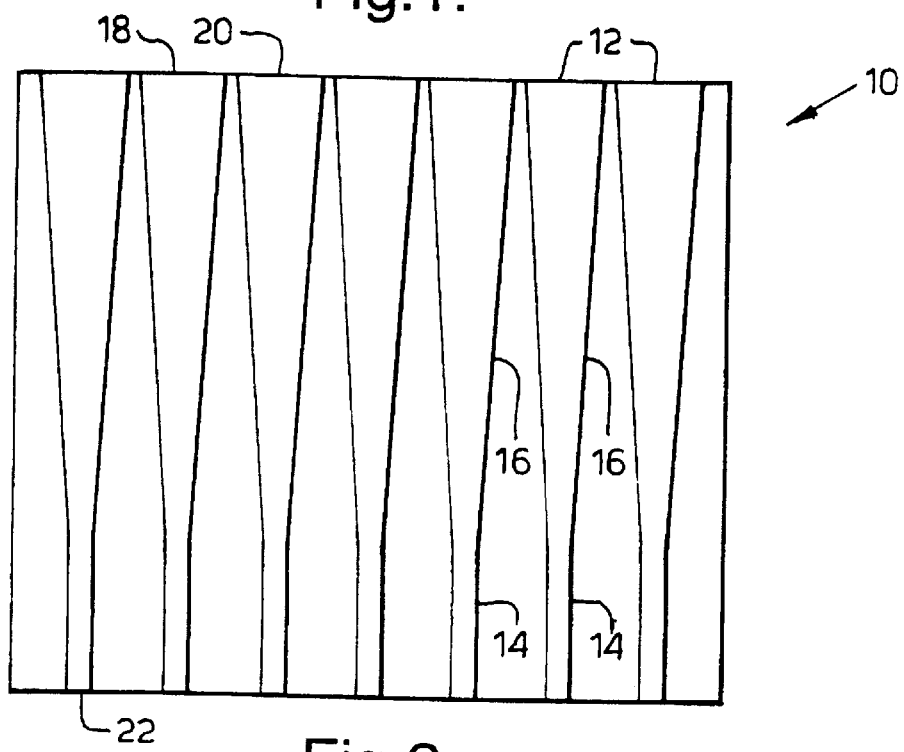
FIG. 1 shows an array of tapered laser waveguides.

FIG. 1 shows an incoherent array 10 of tapered lasers. Each tapered laser in the array 10 comprises a conductive structure 12 which defines a waveguide in active material underlying the conductive structure 12. Seven waveguides adjacent to one another are thus defined. The waveguides have a narrow straight region 14 leading to a tapered region 16. In this embodiment the tapered regions 16 have straight sides. The tapered regions 16 taper out to an output end 18 at an output face 20 of the array 10. The other end of the array is referred to as the input end 22. This is simply for convenience and does not accurately describe its function.

A simple waveguide propagation model (2D BPM) which gives a good representation of the laser optical mode properties is used to determine the dimensions and refractive index step of the waveguides such that most of the power remains in the lowest order transverse mode. Having most of the power in the lowest order mode reduces the possibility of damaging hot spots occurring at the output end 18.

The narrow region 14 is about 3 μm wide and 200 μm long. The tapered region is about 800 μm long and tapers from 3 μm to about 30 μm in width. The array 10 is about 1000 μm in length. The spacing between adjacent waveguides at the output end 18 is about 15 μm. Accordingly the distance from a centre line of a particular waveguide to the centre line of an adjacent waveguide is about 45 μm.

The length of the waveguide is a compromise which is determined by balancing the gain of active material which comprises the tapered laser and loss caused by absorption in the active material. Therefore the length of the waveguide will be, to some extent, determined by the nature of the active materials used and the type of laser.

The effective refractive index step between the waveguide and its surrounding medium is between 0.005 and 0.015. The taper angle is sufficiently small such that in combination with the refractive index step and the waveguide width (or particularly the change in the waveguide width), most or all of the power stays in the fundamental transverse mode. In this embodiment the taper angle is less than 2°.

The input and output faces 22, 20 are formed by cleaving and each have applied reflective coatings. At the input end 22 of the array 10 a high reflectivity (HR) coating is applied. At the output end 18 an anti- reflectivity (AR) coating is applied. These coatings enhance the output power of the lasers. In particular the AR coating prevents backwards travelling light (that is light travelling in a direction from the output end 18 to the input end 22) in the laser from building up to a power which will damage the input end 22. In the preferred embodiment described here the reflectivity of the facet at the input end 22 of the taper is 98% and the reflectivity of the facet at the output end 18 of the taper is between 0.5 and 1%. As each waveguide tapers outwardly towards the output end 18, the optical intensity at this end is not large enough to cause damage to the output face 20. Although this embodiment has a width of 30 μm, an output width of between 5 and 100 μm may be used. This will result in a change in lateral divergence of the light emitted by the output end 18.

Figure 2:
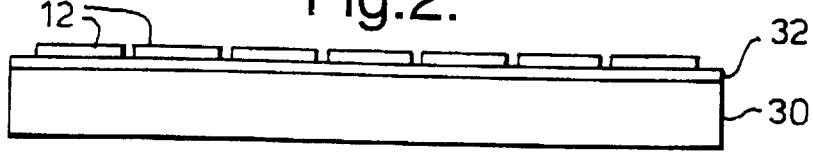
FIG. 2 is an end elevation of the output end of the array of FIG. 1.

FIG. 2 shows the array in broad detail. The structure of the array and its fabrication will be discussed in more detail below.

The array 10 comprises a substrate 30 which may be GaAs, InP or another III–V semiconductor material system. However, the invention could be applicable to any system in which optical waveguides can be defined. On top of the substrate 30 an active region 32 is grown by MOVPE which comprises the laser cavities of the waveguides. The active region 32 has multiple semiconductor layers which are barrier layers (for example GaAlAs) and layers forming the quantum wells (such as InGaAs) and is a graded index separate confinement heterostructure. It is described in more detail below.

A ridge structure 12 is etched at the top surface (or cladding) of the semiconductor layers by dry etching. The ridge structure 12 defines the waveguides in the active region 32. Etching can be carried out by using ion beam techniques although any other suitable method may be used. The array is coated with a dielectric insulating layer which is etched away in the waveguide regions and is coated, in turn, by a conductive layer.

Figure 3:
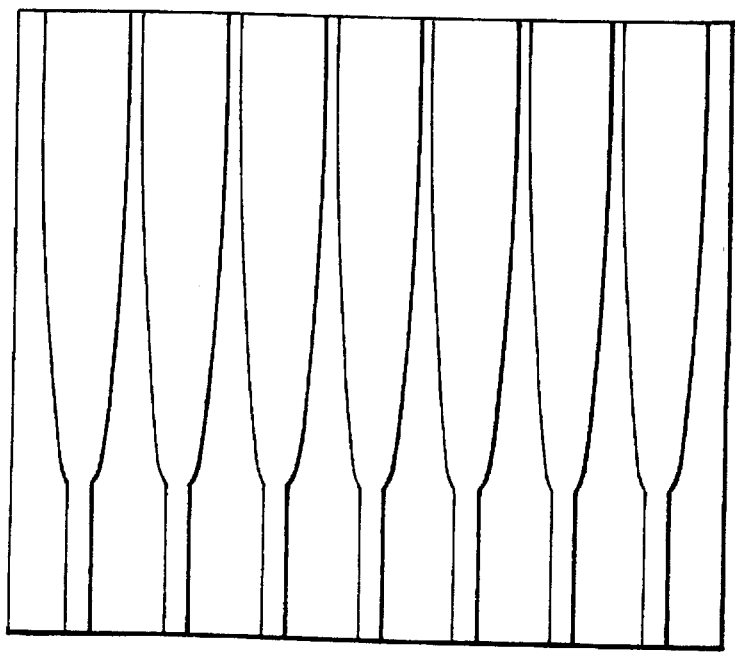
FIG. 3 shows another embodiment of an array of tapered laser waveguides.

FIG. 3 shows an alternative embodiment of an array 10 in which the tapers of the waveguides have tapered regions 16 each having a parabolic shape. The advantage of this shape is that is produces lower transverse mode coupling than a taper with straight sides.

In one embodiment, the active region 32 consists of two InGaAs quantum wells with graded index AlGaAs cladding layers. Heterostructure embodiments may be fabricated with different proportions of Al in their cladding layers. Example proportions are 25% and 35%. The embodiment containing 25% Al provides a more weakly guiding waveguide and hence produces a larger mode-size and a narrower vertical divergence than the embodiment containing 35% Al. This also results in a reduced facet power density and therefore an increased catastrophic optical damage (COD) threshold. The vertical mode profile is spread out further by the use of balanced, graded outer AlGaAs layers. The lateral confinement is imposed by the ridge structure 12 as has been described previously.

In operation, vertical confinement is provided by the heterostructure and lateral confinement is provided by the refractive index difference between the waveguides which is induced by ridge loading. In another embodiment the array 10 may be a buried structure in which case lateral confinement is provided by a refractive index difference due to difference in materials.

In essence the waveguides operate with the narrow regions (laser regions) 14 pumping the fundamental mode of the tapered regions (amplifier regions) 16. The feedback required to establish round-trip gain in the device is very small. In order to limit the power density in the narrow regions 14 the AR and HR coatings are used. For efficient thermal management the array 10 in the form of a chip is mounted p-side down onto a diamond heatsink.

The parameters of the waveguides, such as their dimensions, taper angle and refractive index step are chosen such that the waveguides support only one transverse laser mode. This causes individual tapered lasers in the array 10 to emit light beams which are single moded. This provides a more uniform output and reduces the possibility of "hotspots" occurring across the output face 20 which can cause damage. However, in practice more than one mode may be generated perhaps due to fabrication processes or operation of the array. The parameters (particularly those of width and refractive index step) may be varied for other arrays, for example arrays comprising other materials or arrays which have different structures in order to maintain light being emitted as single mode (or two or three modes). The modes of the individual waveguides are uncoupled.

The spacing between the waveguides is determined by the following factors:

i) it must be as close as possible so that the desired brightness is achieved from the array;

ii) the waveguides must be sufficiently far apart to prevent optical coupling between adjacent waveguides which could produce a multi-lobed far-field and also cause damage to the output face; and iii) the waveguides must be sufficiently far apart to enable efficient heat extraction from the array in order to prevent it from overheating.

Figure 4:
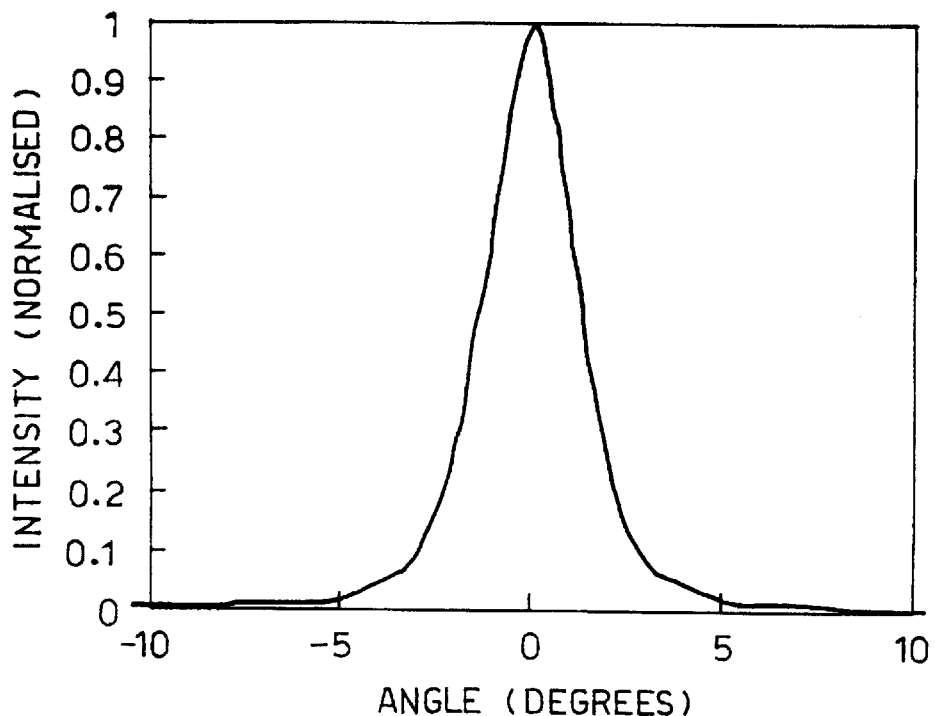
FIG. 4 shows a graph showing lateral far-field of the array.

Referring now to FIG. 4, the far-field angular distribution of the tapers is typically 2° (FWHM) for CW output powers of up to 2W. The embodiment having 35% Al in its cladding layers has a vertical far-field of 36° FWHM. The embodiment having 25% Al in its cladding layers has a vertical far-field of 26° FWHM.

The threshold current densities of the tapered laser arrays for the 25% Al and 35% Al embodiments are 350 Acm$^{-2}$ and 520 Acm$^{-2}$ respectively. The external quantum efficiencies vary from around 0.9 W/A for the higher Al embodiment to 0.75 W/A for the lower Al embodiment when operated to 3 W (pulsed) output power.

Figure 5:
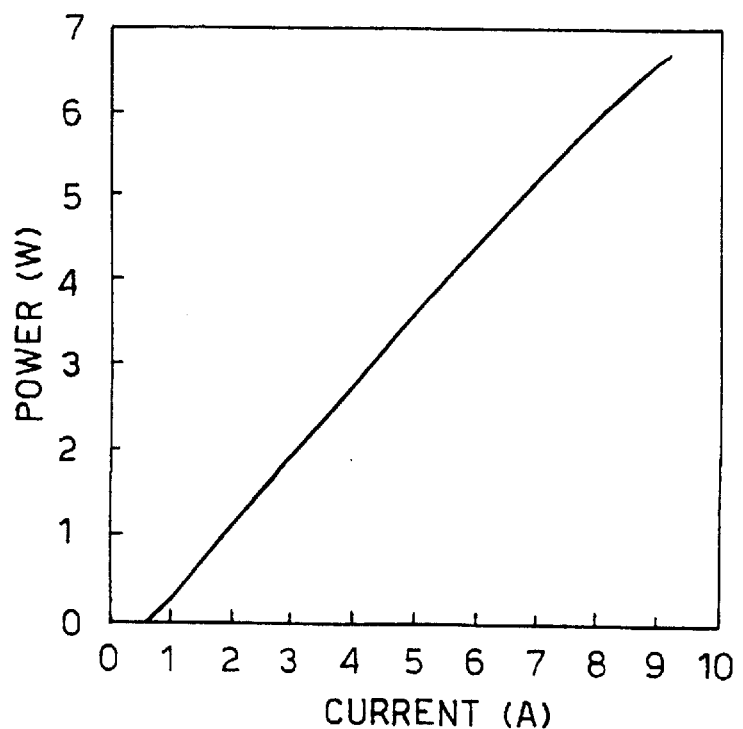
FIG. 5 shows a graph showing the power-current characteristic of the array.

FIG. 5 shows characteristics of CW output powers against current for the 35% Al embodiment. Output powers of 8 W have been achieved. The maximum CW power attainable before the onset of thermal roll-over could be increased further by reducing the device thermal impedance. Pulsed output powers of over 15 W have been demonstrated in these arrays without observation of COD at drive currents of up to 21 A and pulse widths of 3 μs (at 0.3% duty cycle). This corresponds to an output facet intensity of over 70 mW per μm facet.

The results of FIGS. 4 and 5 were obtained from a laser array operating at 0.98 μm. This array has InGaAs quantum wells. However a laser array having GaN quantum wells may operate as low as 0.4 μm.

The spacing between adjacent waveguides could range from 5 μm to over 100 μm depending on the brightness and driving power requirements of the laser and the refractive index step of the waveguide.

What is claimed is:

1. An array (10) of tapered semiconductor lasers each laser comprising a waveguide (12) having a tapered region adjacent waveguides (12) being sufficiently far apart to prevent optical coupling between them in which each tapered region has a taper angle which is sufficiently small so that each laser generates laser light having a single mode as it travels through the tapered section so as to provide an overall array output of laser light having uniform brightness across the width of an output end of the array.

2. An array (10) according to claim 1 in which each waveguide has a laser cavity comprising the tapered region and a mode filtering region defined between reflective end facets.

3. An array (10) according to claim 1 in which each waveguide has a reflective coating at its output end which is of low reflectivity.

4. An array (10) according to claim 1 in which the lasers generate laser light at substantially the same wavelength.

5. An array (10) according to claim 1 in which the taper angle of each tapered region is less than 2°.

6. An array (10) according to claim 1 in which spacing between adjacent waveguides (12) at the output end (20) is between 5 μm and 100 μm.

7. An array (10) according to claim 1 in which the output end of the array has a width between 100 and 500 μm.

8. An array (10) according to claim 7 in which the output end of the array has a width of about 300 μm.

9. An array (10) according to claim 1 in which the waveguides (12) are ridge loaded structures.

10. An array according to claim 1 in which the refractive index step between each waveguide and medium surrounding is between 0.005 and 0.015.

11. An array (10) according to claim 1 in which the waveguides (12) are between 800 and 1200 μm long.

12. An array (10) according to claim 1 in which the waveguides are being 1200 and 2000 μm long.

13. An array according to claim 1 in which a narrow region of each waveguide is between 100 and 300 μm long and the tapered region (16) is between 600 and 900 μm long.

14. An array according to claim 1 in which the narrow region of the waveguides has a width of less than 10 μm long.

15. An array (10) according to claim 1 in which the tapered region (16) tapers out to an output region which is approximately 30 μm.

16. An array (10) according to claim 1 in which the lasers operate in the range of 900 to 1000 nm.

17. An array (10) according to claim 1 which is formed on a single laser chip.

\* \* \* \* \*